United States Patent [19]
Hunley et al.

[11] Patent Number: 5,324,999
[45] Date of Patent: Jun. 28, 1994

[54] INPUT BUFFER WITH COMPENSATED LOW-PASS FILTER NETWORK

[75] Inventors: Steven A. Hunley, Arlington; Kevin M. Ovens, Plano, both of Tex.

[73] Assignee: Texas Instruments Incorporated, Dallas, Tex.

[21] Appl. No.: 966,781

[22] Filed: Oct. 27, 1992

[51] Int. Cl.$^5$ .............................................. H03K 5/12
[52] U.S. Cl. .................... 307/520; 307/521; 307/572; 307/443
[58] Field of Search ............... 307/520, 521, 263, 572, 307/443

[56] References Cited
U.S. PATENT DOCUMENTS

| | | | |
|---|---|---|---|
| 5,191,245 | 3/1933 | Kang | 307/263 |
| 5,233,238 | 8/1993 | Mattos | 307/263 |

Primary Examiner—Richard A. Bertsch
Assistant Examiner—David W. Scheuermann
Attorney, Agent, or Firm—Thomas G. Eschweiler; Robby T. Holland; Richard L. Donaldson

[57] ABSTRACT

An improved buffer circuit with a low-pass filter includes a first variable resistance which forms the input of the buffer circuit and is connected to a clamp circuit, a variable capacitor, a second variable resistance, a third variable resistance, and a buffer. A first compensation circuit is connected between the buffer and the second variable resistance. A second compensation circuit is connected between the buffer and the third variable resistance. First and second compensation circuits provide feedback paths through the second and third variable resistances which enable the voltage at the node connecting the first variable resistance, the clamp circuit, the variable capacitor, and the buffer to be "pulled up" or "pulled down" depending upon the signal transition at the input thereby following the node voltage a the buffer circuit input more quickly thus reducing recovery time and allowing the buffer circuit to concurrently filter noise and increase switching frequency.

17 Claims, 7 Drawing Sheets

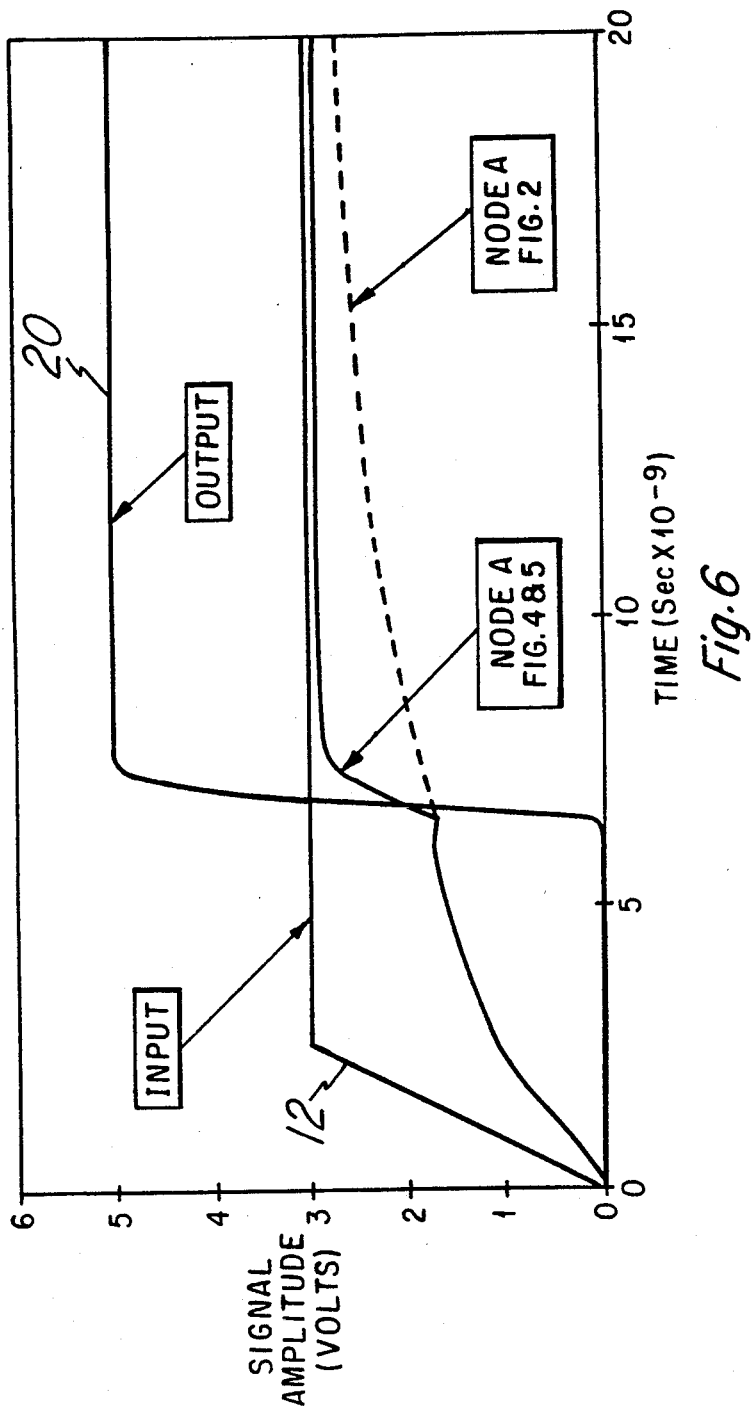

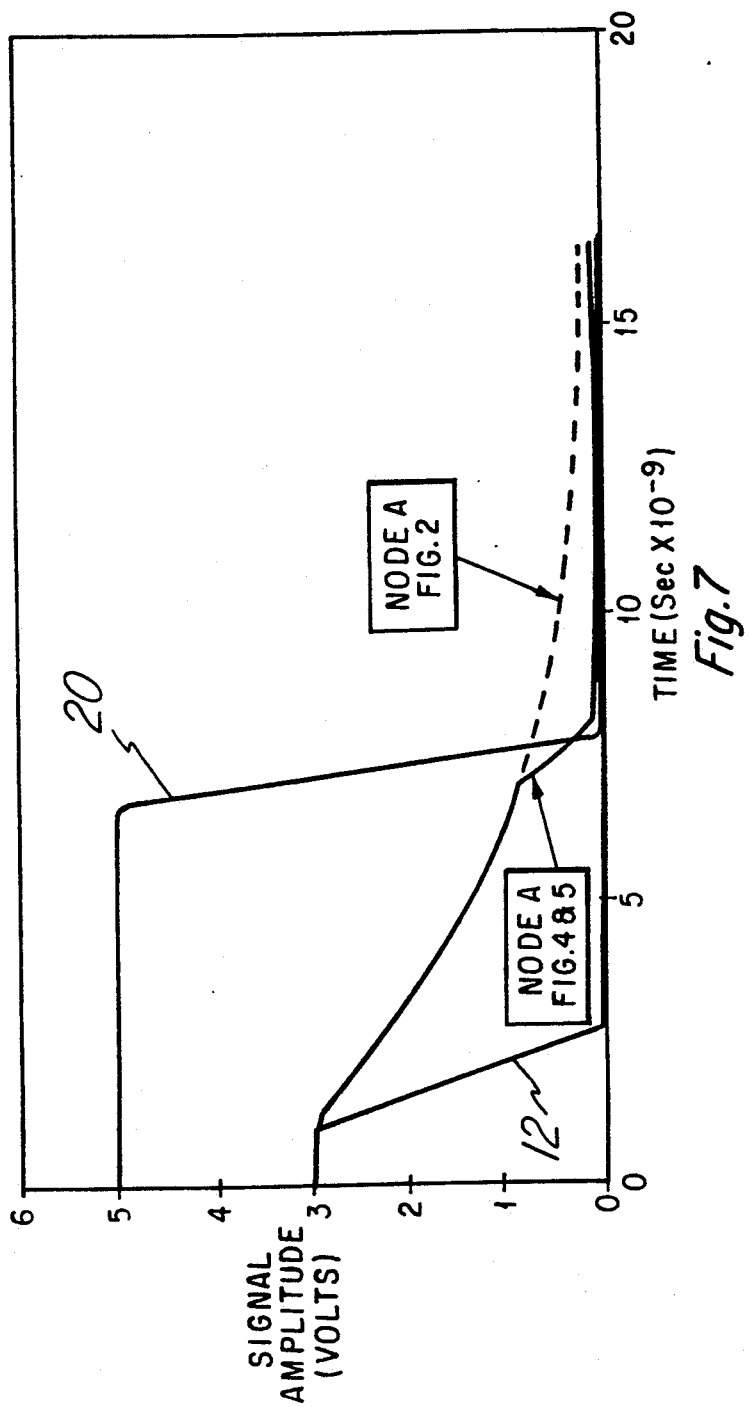

INPUT BUFFER WITH COMPENSATED LOW-PASS FILTER NETWORK

FIELD OF THE INVENTION

This invention relates to electronic circuits and more specifically relates to buffer circuits.

BACKGROUND OF THE INVENTION

Reliable component operation within computer systems is often hampered by noise that exists on bus lines within the system. FIG. 1 illustrates a typical bus line signal 10 and the noise associated with bus line signal 10 compared to a second signal 13 that does not exhibit noise. High frequency noise may result in inadvertent switching in digital circuits where the noise amplitude is large enough to cross digital voltage thresholds.

A standard, prior art method of eliminating noise employs an RC low-pass filter network with a buffer to form an input buffer circuit 22 as shown in FIG. 2. Input buffer circuit 22 includes an input 12 connected to a resistor 14 which is connected at node A to both a capacitor 16 and a buffer 18 possessing hysteresis. The circuit output 20 is the output of buffer 18. Resistor 14 and capacitor 16, in this configuration, form an RC low-pass filter which is well known by those skilled in the art of circuit design. Circuit 22 effectively filters out high frequency noise, however, it suffers from switching speed limitations. Since node A must charge and discharge at a rate dependent upon the RC time constant formed by resistor 14 and capacitor 16, switching of output 20 is limited. As switching speed increases, node A may not fully charge up to the input voltage when input 12 transitions from a low-to-high value. When input 12 then switches low, the voltage at node A is at an unpredictable voltage and inconsistent buffer propagation delays result. "Recovery time", in this instance, describes the time needed for node A to fully charge and is readily seen in FIG. 3. In FIG. 3, node A still has not fully charged to 3 V 17 nanoseconds after input 12 has switched to 3 V. A recovery time of over 30 nanoseconds is common in prior art circuit 22. Additionally, node A may not fully discharge when input 12 transitions from a high-to-low value. When input 12 switches high again, the voltage at node A is at an unpredictable voltage and further inconsistent buffer propagation delays result. "Recovery time", in this instance, describes the time needed for node A to fully discharge.

Therefore, as one attempts to maximize filtering capability by increasing the circuit RC time constant, the recovery time needed increases, thus further hampering switching speed. Conversely, decreasing the RC time constant of circuit 22 to decrease the recovery time results in a degradation of filtering capability. Prior art filtering solutions, therefore, suffer since filtering quality and fast switching capability tend to be mutually exclusive.

It is an object of this invention to provide an improved filtering circuit that enables high filtering quality with decreased recovery time. It is a further object of the invention to provide effective noise filtering in high speed computer applications. Other objects and advantages of the invention will become apparent to those of ordinary skill in the art having reference to the following specification together with the drawings herein.

SUMMARY OF THE INVENTION

An improved buffer circuit with a low-pass filter includes a first variable resistance which forms the input of the buffer circuit and is connected to a clamp circuit, a variable capacitor, a second variable resistance, a third variable resistance, and a buffer. A first compensation circuit is connected between the buffer and the second variable resistance. A second compensation circuit is connected between the buffer and the third variable resistance. First and second compensation circuits provide feedback paths through the second and third variable resistances which enable the voltage at the node connecting the first variable resistance, the clamp circuit, the variable capacitor, and the buffer to be "pulled up" or "pulled down" depending upon the signal transition at the input thereby following the node voltage at the buffer circuit input more quickly thus reducing recovery time and allowing the buffer circuit to concurrently filter noise and increase switching frequency.

BRIEF DESCRIPTION OF THE DRAWINGS

FIG. 6 is a timing diagram illustrating recovery time operation of circuits in FIGS. 4 and 5.

FIG. 7 is a timing diagram further illustrating recovery time operation of circuits in FIGS. 4 and 5.

DETAILED DESCRIPTION OF THE PREFERRED EMBODIMENT

Figure 4:
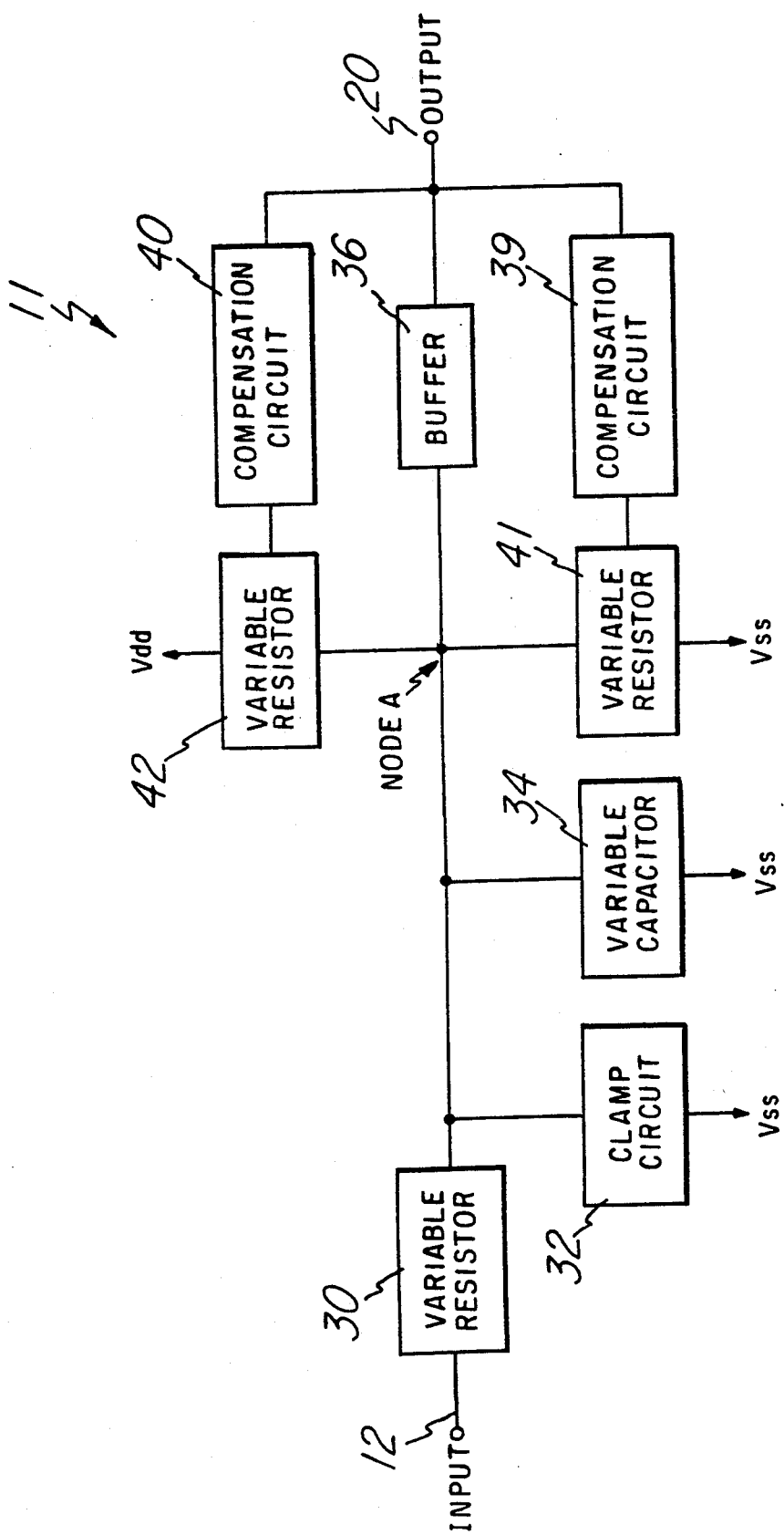
FIG. 4 is a block diagram illustrating the preferred embodiment of the invention.

FIG. 4 is a circuit diagram illustrating the preferred embodiment of the invention. Buffer circuit 11 includes a input 12 connected to a variable resistor 30. Variable resistor 30 is connected to a clamp circuit 32, a variable capacitor 34, a second variable resistor 42, a third variable resistor 41, and a buffer 36 at node A. Buffer 36 possesses hysteresis which is understood to be advantageous for input buffers by those skilled in the art. The output of buffer 36 forms a circuit output 20. A first compensation circuit 40 is connected between the output of buffer 36 and second variable resistor 42. A second compensation circuit 39 is connected between the output of buffer 36 and third variable resistor 41. The term "resistor" is used in the description; however, it should be understood that the term "resistor" may refer to any means of effective electrical resistance and should not be construed in a limiting sense. Vdd and Vss are supply voltages where Vdd>Vss. In this embodiment, Vss is a zero volt reference for all node voltages.

In general, input buffer circuit 11 effectively filters high frequency noise on input 12 via a low-pass filter network formed by first variable resistor 30 and variable capacitor 34. Input buffer circuit 11 also significantly reduces the recovery time at node A over prior art circuit 22 of FIG. 2 through first compensation circuit 40 and second variable resistor 42 when input 12 transitions from a low-to-high voltage value and through second compensation circuit 39 and third variable resistor 41 when input 12 transitions from a high-to-low voltage value. Recovery time at node A is defined as the time it takes for node A to reach a stable voltage nearly equal to the voltage present at input 12 immediately after a switching transition at input 12. First compensation circuit 40 senses a change in the logic state when node A transitions from a low logic level to a voltage level greater than the threshold voltage of buffer 36 and manipulates second variable resistor 42 such that node A gets "pulled up" toward voltage source Vdd. More specifically, first compensation circuit 40 manipulates second variable resistor 42 by decreasing the resistance of second variable resistor 42 such that a charging current is supplied to variable capacitor 34 causing the voltage at node A to rapidly increase toward Vdd. After a designed delay, first compensation circuit 40 again manipulates second variable resistor 42 by increasing the resistance of second variable resistor 42 such that charging current from Vdd no longer flows into variable capacitor 34 and the voltage at node A no longer increases towards Vdd resulting in the voltage at node A being stable and nearly equal to the voltage at input 12. In situations when the voltage at node A increases above the voltage at input 12, clamp circuitry 32 is activated to quickly discharge the voltage at node A back down to a stable value nearly equal to the voltage at input 12.

Similarly, when input 12 transitions from a high-to-low voltage value, second compensation circuit 39 manipulates third variable resistor 41 such that third variable resistor 4 provides a low impedance discharge path for variable capacitor 34 such that node A gets "pulled down" toward voltage source Vss. After a designed delay, second compensation circuit 39 again manipulates third variable resistor 41 such that the low impedance discharge path is discontinued. In this manner the voltage at node A quickly approximates the voltage at input 12 after input 12 transitions from a high-to-low voltage level. The swift establishment of a stable, predictable voltage at node A following a logic transition at input 12 allows circuit 11 to operate at high operating frequencies while concurrently providing consistent propagation delays between input 12 and output 20.

Figure 5:
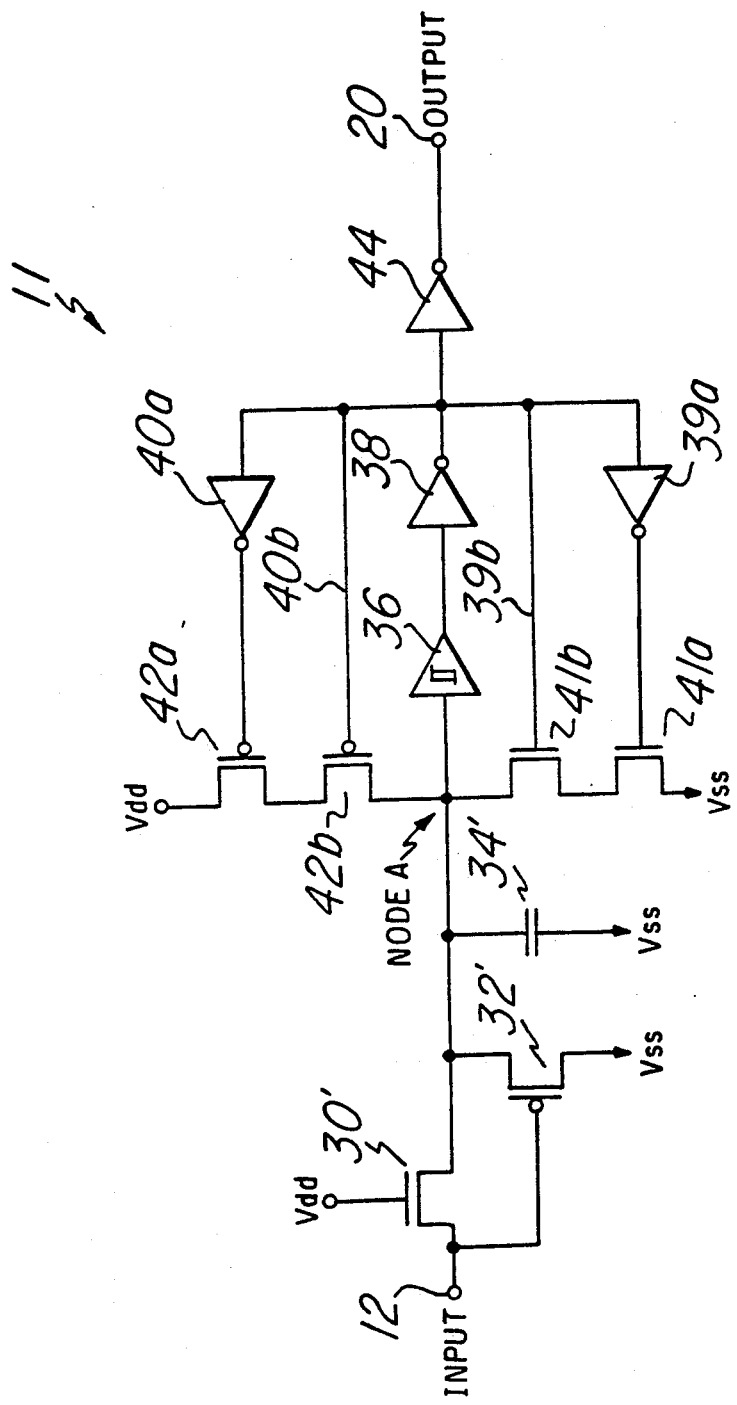
FIG. 5 is a partial logic, partial schematic diagram illustrating the preferred embodiment of the invention.

FIG. 5 illustrates a circuit level diagram of buffer circuit 11 of FIG. 4. An NMOS transistor 30' may operate as first variable resistor 30. The gate of transistor 30' is connected to voltage source Vdd. Connected between node A and Vss is a PMOS transistor 32' which operates as clamp circuit 32. The gate of transistor 32' is also tied to input 12. A variable capacitor 34' is connected between node A and voltage source Vss. Capacitor 34' is a lumped parameter for purposes of discussion clarity which consists of drain-to-Vss capacitance of transistors 30', 32', 41b, 42b, and the gate-to-Vss input capacitance of buffer 36. Capacitor 34' may further consist of additional discrete oxide or junction capacitances a required by design.

Still referring to FIG. 5, a first inverter 38 is connected to the output of buffer 36. A second inverter 44 is connected to the output of first inverter 38. The output of second inverter 44 forms the output of circuit 11. A third inverter 40a and a line 40b comprise first compensation circuit 40 of FIG. 4. Third inverter 40a provides a time delay and a signal inversion in which a PMOS transistor 42a is controlled. Line 40b acts as a control signal for another PMOS transistor 42b. Transistor 42b is also connected to node A. Transistors 42a and 42b act as second variable resistor 42 in FIG. 4.

They are connected in series between Vdd and node A. When both transistors 42a and 42b are conducting they behave as a virtual short circuit between Vdd and node A. When either transistor 42a or 42b is non-conducting they behave as a virtual open circuit between Vdd and node A.

Still referring to FIG. 5, a fourth inverter 39a and a line 39b comprise second compensation circuit 39 of FIG. 4. Fourth inverter 39a provides a time delay and a signal inversion in which an NMOS transistor 41a is controlled. Line 39b acts as a control signal for another NMOS transistor 41b. Transistor 41b is also connected to node A. Transistors 41a and 41b act as third variable resistor 41 in FIG. 4. They are connected in series between Vss and node A. When both transistors 41a and 41b are conducting they behave as a virtual short circuit between Vss and node A. When either transistor 41a or 41b is non-conducting they behave as a virtual open circuit between Vss and node A.

Circuit 11 advantageously provides effective low-pass filtering of noise at input 12 while concurrently providing fast recovery time at node A in the following manner. When input 12 is at a low voltage (0 V), the voltage at node A and output 20 is also at 0 V. When input 12 is switched (input 12 increases from 0 V to 3 V which is considered a high digital value for input 12) circuit 11 begins its filtering function. Transistor 30' acts as a variable resistor depending upon the voltage value at its gate and its size. In this particular embodiment, the gate of transistor 30' is tied to Vdd and the resistance of transistor 30' is determined by its "on" resistance value, Rds(on). The voltage at node A increases slowly; the rate of increase of the voltage at node A is determined by the RC time constant ($\tau$). In this case the RC time constant ($\tau$) of circuit 11 is:

$$\tau = Rds(on)_{30'} * C(node\ A)$$

where C(node A) is variable capacitor 34'. As soon as the voltage at node A rises above the positive going threshold voltage ($V_{t+}$) of buffer 36, (which in this particular embodiment is approximately 1.6 V) output 20 switches. It is highly desirable, at the moment node A reaches the voltage threshold ($V_{t+}$) of buffer 36, to increase the voltage at node A rapidly to a voltage nearly equal to the voltage at input 12, thus quickly establishing a stable voltage at node A. The rapid stabilization of the voltage at node A allows for the subsequent high-to-low transition at input 12 to occur more quickly thus increasing the operating frequency capability of the buffer circuit 11 design. If the high-to-low transition at input 12 were to occur before node A achieved a predictable, stable voltage nearly equal to the high level voltage at input 12, then the input 12-to-output 20 propagation delay time would require a designer to account for a wider tolerance range of propagation delay times. In prior art circuit 22, practical operating frequency requirements are compromised by large propagation time tolerance ranges caused by node A not achieving a predictable, stable voltage level before the next voltage transition. With voltage predictability at node A, circuit 11 produces consistent propagation delay times between input 12 and output 20 during high frequency switching.

Figure 1:
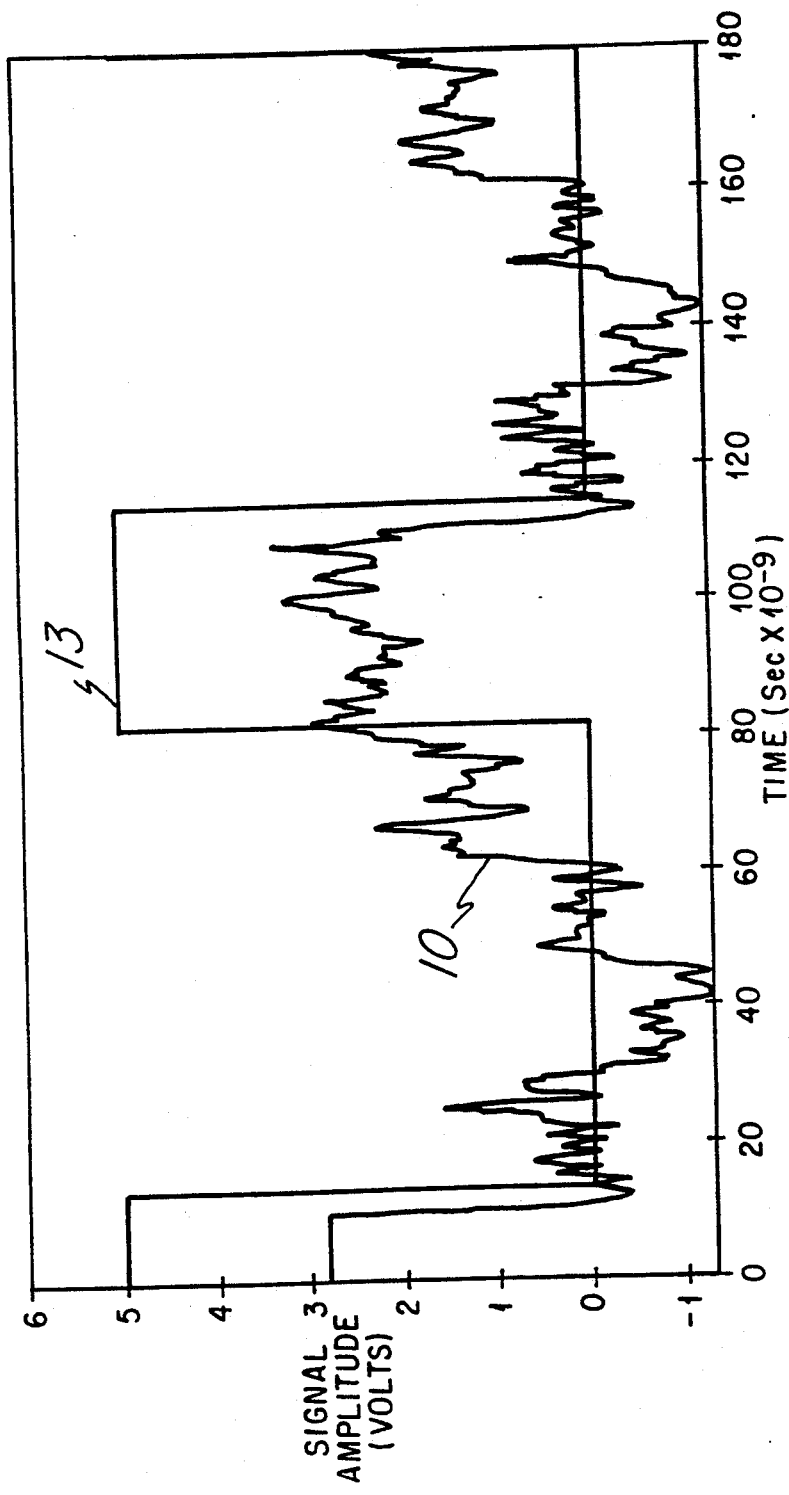
FIG. 1 is a diagram illustrating noise on a standard bus line signal 10.
Figure 2:
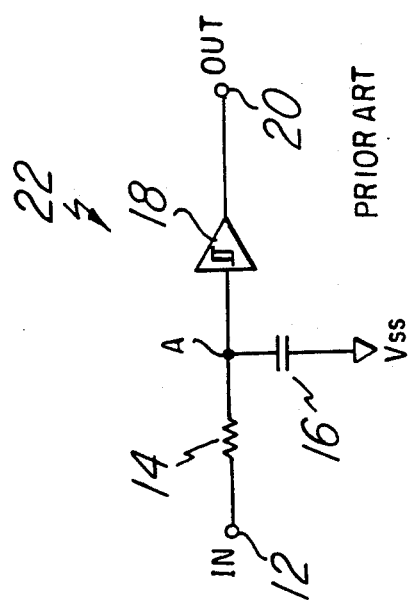
FIG. 2 is a prior art circuit diagram illustrating an input filter employing an RC low-pass network.

FIG. 6 clearly illustrates the advantageousness of circuit 1 of FIGS. 4 and 5 over that of FIG. 2. After switching input 12, at approximately 6.5 nanoseconds, as shown in the graph, output 20 is transitioning from 0

Figure 3:
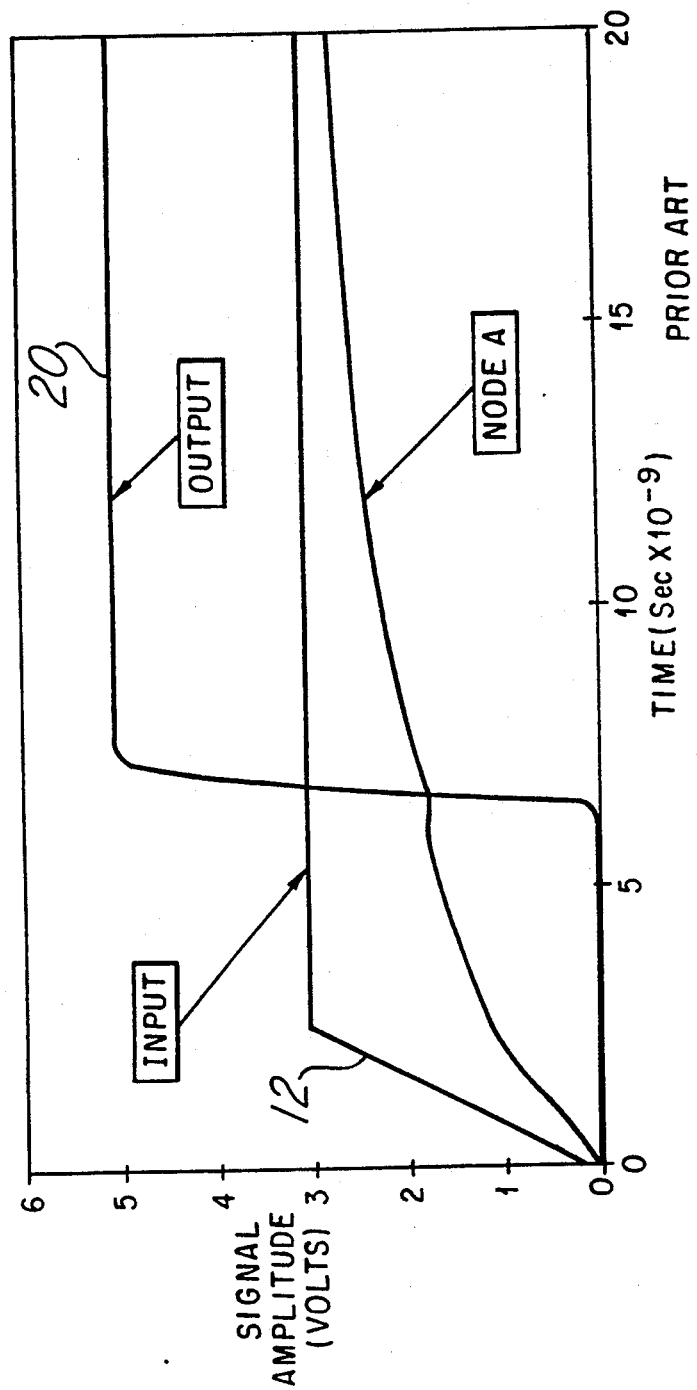
FIG. 3 is a timing diagram illustrating the effect of the prior art RC low-pass filter of FIG. 2 on recovery time.

V to 5 V, input 12 is at 3 V, and node A is at approximately 1.7 V. If, 5 nanoseconds later, input 12 switches low, node A of FIGS. 2 and 3 has not yet reached the input 12 value of 3 V (it is then at approximately 2.3 V) and output 20 will respond more quickly than normal. Therefore the propagation delay between input 12 and output 20 is not predictable; in this case the propagation delay between input 12 and output 20 would be shorter than normal. It can be seen that without node A at a stabilized, predictable voltage level, the propagation delay between input 12 and output 20 will be inconsistent and thus undesirable.

Still referring to FIG. 6, in circuit 11, when input 12 of FIG. 5 increases to 3 V, the voltage at node A of FIGS. 4 and 5 increases at the rate determined by time constant $\tau$ until node A reaches the threshold voltage ($V_{t+}$) of buffer 36. At that instant, buffer 36 activates inverter 38 which feeds line 40b and inverter 40a. Line 40b transitions to the low state (0 V) which turns on transistor 42b. Since transistor 42a is already in the "on" state, 42a and 42b allow charging current to flow from Vdd to capacitor 34', causing a rapid increase in the voltage level of node A. After a short time delay (determined by the signal propagation delay through inverter 40a) transistor 42a turns off thus greatly increasing the effective resistance between Vdd and node A. This stops node A from increasing in value. Compensation from line 40b and inverter 40a aids in "pulling up" the voltage at node A. In this manner, the voltage at node A more quickly arrives at a stable voltage nearly equal to that of input 12 thus allowing input 12 to switch earlier with a predictable propagation delay between input 12 and output 20. Circuit 11 greatly decreases the recover time at node A from approximately 30 nanoseconds in prior art circuits to approximately 2-3 nanoseconds.

In cases where capacitor 34' receives an excessive amount of compensation charge and results in the voltage level of node A rising above the voltage level at input 12, the clamp circuit 32' shunts the excess charge and clamps the voltage level at node A t a value nearly equal to the voltage level at input 12. For circuit 11 in FIG. 5, when the voltage at node A increases above input 12 by at least the threshold voltage ($V_{t+}$) of transistor 32', transistor 32' turns on and attempts to pull the voltage at node A down to Vss. As soon as node A drops below a $V_t$ (threshold voltage of transistor 32') of input 12 transistor 32' turns off. Therefore, transistor 32' effectively clamps node A to the voltage at input 12 when node A rises above the voltage at input 12.

In FIG. 5, when input 12 is at a high voltage level (3 V) the voltage at node A is approximately 3 V and the voltage at output 20 is approximately 5 V. When input 12 is switched, circuit 11 begins its filtering function. The voltage at node A decreases slowly; the rate of decrease of the voltage at node A is determined by the RC time constant ($\tau$). As soon as the voltage at node A falls below the negative going threshold ($V_{t-}$) of buffer 36 (which in this particular embodiment is approximately 1.0 V) output 20 switches. It is highly desirable, at the moment node A reaches the voltage threshold ($V_{t-}$): of buffer 36, to decrease the voltage at node A rapidly to a voltage nearly equal to the voltage at input 12, thus quickly establishing a stable voltage at node A. With voltage predictability at node A, circuit 11 produces consistent propagation delay times between input 12 and output 20 during high frequency switching.

FIG. 7 clearly illustrates the advantageousness of circuit 11 of FIGS. 4 and 5 over that of prior art FIG. 2. After switching, at approximately 7.0 nanoseconds, as shown in the graph, output 20 is transitioning from 5 V to 0 V, input 12 is at 0 V, and node A is at approximately 1 V. If, 5 nanoseconds later, input 12 switches high, node A of FIG. 2 has not yet reached input 12 value of 0 V (it is at approximately 0.45 V) and output 20 will respond more quickly than normal. Therefore, the propagation delay between input 12 and output 20 is not predictable. It can be seen without node A at approximately the same voltage as input 12 the propagation delay between input 12 and output 20 will be inconsistent and therefore undesirable.

Still referring to FIG. 7, in circuit 11, when input 12 of FIG. 5 decreases to 0 V, the voltage at node A of FIGS. 4 and 5 decreases at the rate determined by time constant $\tau$ until node A reaches the threshold voltage ($V_{t-}$) of buffer 36. At that instant, buffer 36 activates inverter 38 which feeds line 39b and inverter 39a. Line 39b transitions to a high state (5 V) which turns on transistor 41b. Since transistor 41a is already in the "on" state, 41a and 41b provide a low impedance discharge path for capacitor 34', causing a rapid decrease in the voltage level of node A. After short time delay (determined by the signal propagation delay through inverter 39a) transistor 41a turns off thus greatly increasing the effective resistance between Vss and node A. This stops node A from decreasing in value. Compensation from line 41b and inverter 39a aids in "pulling down" the voltage at node A. In this manner, the voltage at node A more quickly arrives at a stable voltage nearly equal that of input 12 thus allowing input 12 to switch earlier with a predictable propagation delay between input 12 and output 20.

Compensated input buffer circuit 11 effectively filters high frequency noise while concurrently providing a reduction in recovery time, and provides an effective buffer circuit that meets or exceeds both noise-filtering and operating-frequency requirements of practical digital bus interface applications.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

What is claimed is:

1. A non-inverting high frequency filtering circuit having significantly reduced recovery times, comprising:
   a buffer having an input and an output, the output forming the circuit output;
   a first variable resistance connected between the input of the buffer and an input of the circuit;
   a second variable resistance connected between the input of the buffer and a first voltage source;
   a variable capacitor connected between the input of the buffer and a second voltage source; and
   a first compensation circuit connected between the output of the buffer and the second variable resistance.

2. The circuit of claim 1 wherein the first variable resistance comprises an NMOS transistor with a drain terminal connected to the input of the circuit, a gate terminal connected to the first voltage source, and a source terminal connected to the input of the buffer.

3. The circuit of claim 1 wherein the low-pass filter portion of the circuit comprises the first variable resistance and the variable capacitor whereby the low-pass filter rejects high frequency signals and accepts low frequency signals.

4. The circuit of claim 1 further comprising a clamp circuit connected between the input of the buffer and a second voltage source.

5. The circuit of claim 4 wherein the clamp circuit further comprises a first PMOS transistor having a source terminal connected to the input of the buffer, a drain terminal connected to the second voltage source, and a gate connected to the input of the circuit whereby the source terminal of the first PMOS transistor, when increased to a threshold voltage above the gate terminal, conducts thereby clamping the voltage at the source terminal to the voltage at the input of the circuit.

6. The circuit of claim 4 wherein the variable capacitor comprises the combined capacitances associated with the first variable resistance, the second variable resistance, the third variable resistance, the clamp circuit, and the buffer.

7. The circuit of claim 1 further comprising a first inverter having an input and an output, the input of the first inverter connected between the output of the buffer and the first compensation circuit, the output of the inverter also forming the circuit output, whereby the circuit forms an inverting high frequency filtering circuit.

8. The circuit of claim 7 further comprising a second inverter having an input and an output, the input of the second inverter connected to the output of the first inverter and the output of the second inverter forming the circuit output, whereby the circuit forms a non-inverting high frequency filtering circuit.

9. The circuit of claim 8 wherein the second variable resistance comprises:
   a second PMOS transistor having a drain terminal connected to the first voltage source, a gate terminal connected to the first compensation circuit, and a source terminal; and
   a third PMOS transistor having a drain terminal connected to the source terminal of the second PMOS transistor, a gate terminal connected to the first compensation circuit, and a source terminal connected to the input of the buffer, whereby the second PMOS transistor and the third PMOS transistor work together to provide a variable resistance ranging from a virtual short circuit to a virtual open circuit thus aiding in the "pull-up" of the voltage at the input of the buffer and substantially reducing the recovery time of the circuit.

10. The circuit of claim 9 wherein the first compensation circuit comprises:
   a line for transmission of a voltage signal connected from the output of the first inverter to the gate of the third PMOS transistor wherein the line provides conduction control of the third PMOS transistor; and
   a third inverter having an input and an output, the input of the third inverter connected to the output of the first inverter and the output of the third inverter connected to the gate terminal of the second PMOS transistor whereby the third inverter provides conduction control of the second PMOS transistor.

11. The circuit of claim 1 further comprising:
   a third variable resistance connected between the input of the buffer and a second voltage source; and
   a second compensation circuit connected between the output of the buffer and the third variable resistance.

12. The circuit of claim 11 wherein the third variable resistance comprises:
   a second NMOS transistor having a source terminal connected to the second voltage source, a gate terminal connected to the second compensation circuit, and a drain terminal; and
   a third NMOS transistor having a source terminal connected to the drain terminal of the second NMOS transistor, a gate terminal connected to the second compensation circuit, and a drain terminal connected to the input of the buffer, whereby the second NMOS transistor and the third NMOS transistor work together to provide a variable resistance ranging from a virtual short circuit to a virtual open circuit thus aiding in the "pull-down" of the voltage at the input of the buffer and substantially reducing the recovery time of the circuit.

13. The circuit of claim 11 further comprising a first inverter having an input and an output, the input of the first inverter connected to the output of the buffer and the output of the first inverter connected to the second compensation circuit and the circuit output, whereby the circuit forms an inverting high frequency filtering circuit.

14. The circuit of claim 13 further comprising a second inverter having an input and an output, the input of the second inverter connected to the output of the first inverter and the output of the second inverter forming the circuit output.

15. The circuit of claim 14 wherein the second compensation circuit comprises:
   a line for transmission of a voltage signal connected from the output of the first inverter to the gate of the third NMOS transistor wherein the line provides conduction control of the third NMOS transistor; and
   a fourth inverter having an input and an output, the input of the fourth inverter connected to the output of the first inverter and the output of the fourth inverter connected to the gate terminal of the second NMOS transistor whereby the fourth inverter provides conduction control of the second NMOS transistor.

16. A circuit with a compensated low-pass filter network, comprising:
   a first NMOS transistor with a drain terminal forming an input for the circuit, a gate terminal and a source terminal;
   a first PMOS transistor with a source terminal connected to the source terminal of the first NMOS transistor, a gate terminal connected to the drain of the first NMOS transistor and a drain terminal;
   a first voltage source connected to the gate terminal of the first NMOS transistor;
   a second voltage source connected to the drain terminal of the first PMOS transistor;
   a buffer having an input and an output, the input connected to the source terminal of the first NMOS transistor;
   a first inverter having an input and an output, the input connected to the output of the buffer;

a second inverter having an input and an output, the input connected to the output of the first inverter and the output forming an output for the circuit;

a third inverter having an input and an output, the input connected to the output of the first inverter;

a fourth inverter having an input and an output, the input connected to the output of the first inverter;

a second PMOS transistor having a drain terminal connected to the source terminal of the first NMOS transistor, a gate terminal connected to the output of the first inverter and a source terminal;

a third PMOS transistor having a drain terminal connected to the source terminal of the second PMOS transistor, a gate terminal connected to the output of the third inverter, and a source terminal connected to the first voltage source;

a second NMOS transistor having a drain terminal connected to the source terminal of the first NMOS transistor, a gate terminal connected to the output of the first inverter and a source terminal; and a third NMOS transistor having a drain terminal connected to the source terminal of the second NMOS transistor, a gate terminal connected to the output of the fourth inverter, and a source terminal connected to the second voltage source.

17. The circuit of claim 16 wherein the buffer possesses hysteresis.

* * * * *